(12) United States Patent
Kalnitsky et al.

(10) Patent No.: US 7,759,727 B2
(45) Date of Patent: Jul. 20, 2010

(54) METHOD AND APPARATUS FOR SHIELDING TUNNELING CIRCUIT AND FLOATING GATE FOR INTEGRATION OF A FLOATING GATE VOLTAGE REFERENCE IN A GENERAL PURPOSE CMOS TECHNOLOGY

(75) Inventors: Alexander Kalnitsky, San Francisco, CA (US); John M. Caruso, Fremont, CA (US)

(73) Assignee: Intersil Americas Inc., Palm Bay, FL (US)

( * ) Notice: Subject to any disclaimer, the term of this patent is extended or adjusted under 35 U.S.C. 154(b) by 440 days.

(21) Appl. No.: 11/639,658

(22) Filed: Dec. 14, 2006

(65) Prior Publication Data

US 2008/0044973 A1    Feb. 21, 2008

Related U.S. Application Data

(60) Provisional application No. 60/839,262, filed on Aug. 21, 2006.

(51) Int. Cl.
*G11C 16/04* (2006.01)
(52) U.S. Cl. .................... 257/321; 438/264; 365/185.26
(58) Field of Classification Search ................. 438/264; 257/321; 365/185.1, 185.26, 185.29
See application file for complete search history.

(56) References Cited

U.S. PATENT DOCUMENTS 4,970,565 A    11/1990   Wu et al.
5,300,802 A *  4/1994   Komori et al. ......... 365/185.33
5,576,568 A    11/1996  Kowshik
5,923,584 A *  7/1999   Roberts et al. .............. 365/182
6,137,723 A    10/2000  Bergemont et al.

(Continued)

FOREIGN PATENT DOCUMENTS

EP    0 889 520 A    1/1999

(Continued)

OTHER PUBLICATIONS

Srinivasan, et al., "A Precision CMOS Amplifier Using Floating-Gates For Offset Cancellation", IEEE 2005 Custom Integrated Circuits Conference, pp. 739-742, (2005).

(Continued)

*Primary Examiner*—Kiesha R Bryant
*Assistant Examiner*—Mark W Tornow
(74) *Attorney, Agent, or Firm*—Donald L. Bartels

(57) ABSTRACT

A method and corresponding structure for shielding a floating gate tunneling element. The method comprises disposing a floating gate over a gate oxide using standard CMOS processing in two active areas defined by first and second doped well regions formed in a substrate surrounded by field oxide, and forming a floating gate shield layer so as to enclose the floating gate. The floating gate includes a first floating gate portion over an active area in the first doped well region and a second floating gate portion over the active area in the second doped well region. The first floating gate portion is substantially smaller than the second floating gate portion so as to enable adequate voltage coupling for Fowler-Nordheim tunneling to occur between the first doped well region and the first floating gate portion. The direction of tunneling is determined by high voltage application to one of the doped well regions.

18 Claims, 6 Drawing Sheets

U.S. PATENT DOCUMENTS

| | | | |
|---|---|---|---|
| 6,157,574 | A | 12/2000 | Kalnitsky et al. |
| 6,238,979 | B1 | 5/2001 | Bergemont |
| 6,271,560 | B1 | 8/2001 | Kalnitsky et al. |
| 6,500,750 | B1 * | 12/2002 | Shroff et al. ................ 438/622 |
| 6,512,700 | B1 * | 1/2003 | McPartland et al. .... 365/185.28 |
| 6,631,087 | B2 * | 10/2003 | Di Pede et al. ......... 365/185.18 |
| 6,788,574 | B1 | 9/2004 | Han et al. |
| 6,794,236 | B1 * | 9/2004 | Hu ............................. 438/201 |
| 6,847,551 | B2 | 1/2005 | Owen |
| 7,057,232 | B2 * | 6/2006 | Ausserlechner ............. 257/316 |
| 7,095,076 | B1 | 8/2006 | Han et al. |
| 7,375,393 | B1 * | 5/2008 | Mirgorodski et al. ....... 257/316 |
| 2005/0219912 | A1 * | 10/2005 | Gendrier et al. ........ 365/185.29 |
| 2005/0270850 | A1 | 12/2005 | Wang et al. |
| 2006/0081910 | A1 * | 4/2006 | Yu et al. ..................... 257/315 |

FOREIGN PATENT DOCUMENTS

| | | |
|---|---|---|
| FR | 2 838 554 | 10/2003 |
| JP | 03 057280 A | 3/1991 |
| JP | 2004 296479 A | 10/2004 |
| WO | WO 00/59038 A | 10/2000 |

OTHER PUBLICATIONS

Ahuja, et al., "A Very High Precision 500-nA CMOS Floating-Gate Analog Voltage Reference", IEEE Journal of Solid-State Circuits, vol. 40, No. 12, pp. 1-9, (2005).

* cited by examiner

METHOD AND APPARATUS FOR SHIELDING TUNNELING CIRCUIT AND FLOATING GATE FOR INTEGRATION OF A FLOATING GATE VOLTAGE REFERENCE IN A GENERAL PURPOSE CMOS TECHNOLOGY

CROSS REFERENCE TO RELATED APPLICATION

This application claims the benefit of U.S. Provisional Application No. 60/839,262, filed Aug. 21, 2006, which is incorporated by reference herein.

FIELD OF THE INVENTION

The invention relates in general to floating gate circuits, and more specifically to tunneling elements for high precision floating gate voltage reference circuits.

BACKGROUND OF THE INVENTION

High precision analog floating gate voltage reference circuits are described in U.S. Pat. No. 6,847,555, issued Jan. 25, 2005, which is incorporated by reference herein. The operating principles of high precision CMOS floating gate analog voltage references are also described in an article by Ahuja, B. K., et al., entitled "A very high precision 500-nA CMOS floating-gate analog voltage reference", IEEE Journal of Solid-State Circuits, Volume 40, Issue 12, December 2005 Page(s): 2364-2372, which is incorporated by reference herein. FIG. 1A is an illustrative prior art equivalent circuit diagram 10 for the floating gate reference circuit. As described in the Ahuja reference identified above, two tunneling elements, tunnel diodes T1 and T2, are needed to set a fixed voltage on the floating gate node at the junction therebetween. Basically, using Fowler-Nordheim tunneling through the inter-poly oxide, the tunneling element T1 is used to charge the floating gate node during programming by raising VP, and by lowering VN, the tunneling element T2 is used to discharge the floating gate node. When the voltage on the floating gate node reaches the desired set level, both of the tunneling elements are turned off by making VP and VN about zero volts. Thus, a fixed charge is stored permanently on the floating gate for normal operation of the device.

FIG. 1B is a cross-sectional view and exemplary circuit diagram illustrating the series connected tunneling elements T1 and T2 in FIG. 1A. The prior art equivalent circuit diagram is shown at 20 and the physical implementation cross-section is shown at 30. As seen in the cross section, there is a polysilicon layer (poly1) and another polysilicon layer (poly2) layer formed on a substrate along with two electron tunneling regions. In two predetermined locations which define these tunneling regions, the poly2 layer overlaps the poly1 layer with a thin oxide dielectric between them. Typically, polysilicon layers 1 and 2 are separated from each other by about 400 A of oxide dielectric, with the floating gate, FG, being completely surrounded by dielectric. The electrically isolated floating gate comprises the poly1 layer and poly2 layer connected together, as shown at contact region 70. At the poly1/poly2 edges, enhanced emission tunneling occurs at tunneling voltages of about 10-12 V. Both tunnel regions have a given capacitance.

One drawback of the physical implementation shown in FIG. 1B is that its formation requires a special non-standard CMOS process that does not lend itself to simple analogue design. That is, the special process requiring for forming the structure in FIG. 1B does not utilize well known and less costly general purpose CMOS technology, also referred to herein as standard CMOS processes. Another drawback of this implementation is the inability of the process to completely cover the floating gate element with a conductive layer and thus isolate the floating gate from the overlying dielectrics. As a result of this, low concentrations of mobile and polarization charges that are always present in the dielectric over the floating gate may affect the amount of charge stored in the floating gate. It is thus desired to construct the tunnel diode structure using general purpose CMOS technology which provides for a full enclosure of the floating gate element. A memory device that includes floating-gate based capacitor and transistor elements formed using standard CMOS processes is described in co-pending application, "A multiple time programmable (MTP) PMOS floating gate-based non-volatile memory device for a general-purpose CMOS technology with thick gate oxide", application Ser. No. 11/498,672, which is incorporated by reference herein. There is a need for using general purpose CMOS technology for constructing a tunneling element structure that is usable for a high precision voltage reference circuit.

Floating gate based devices required to store a precise amount of charge on the floating gate (as in floating gate reference circuits) are highly susceptible to the presence of low density mobile ions and polarization charges that are always present in dielectrics deposited over the floating gate. Mobile and polarization charge densities are usually not sufficient to adversely affect circuit performance for devices that do not need high precision voltages. For instance, such effects do not adversely affect circuit performance of the memory device described in the aforementioned co-pending application. In contrast, to provide a high precision floating gate voltage reference circuit, the floating gate is required to be shielded from the overlaying dielectrics in order to minimize the reaction of stored charge with mobile and polarization charges. A drawback of known methods using standard CMOS processes is that they do not provide the required shielding of the floating gate necessary for high precision floating gate voltage reference circuits.

A floating gate shield is commonly formed by the coupling capacitor polysilicon layer present in most EEPROM or flash EEPROM technologies. A drawback of this known method is that EEPROM technologies do not provide the device set required for precision analog voltage reference circuits and for achieving high levels of integration. The high levels of integration required for high precision circuits can be accomplished by embedding the EEPROM in a general purpose CMOS technology. A drawback of this embedding process is that is it very costly, due primarily to the large number of additional process operations required. Another drawback is that, when utilizing the known available structures, small regions of the floating gate node may be unshielded resulting in degraded performance.

There is therefore a need for a device and corresponding method of constructing a structure using general purpose CMOS technology that provides both Fowler-Nordheim tunneling functionality and a shielded floating gate needed for a high precision floating gate voltage reference.

SUMMARY OF THE INVENTION

The present invention provides a device and corresponding method of shielding a floating gate-based tunneling element fabricated in a general purpose CMOS technology.

Broadly stated, the present invention provides a method of shielding a floating gate tunneling element structure comprising the steps of disposing a floating gate over a gate oxide in two active areas defined by first and second doped well regions in a substrate, the floating gate including a first floating gate portion over the first doped well region and a second floating gate portion over the second doped well region, wherein the first floating gate portion is substantially smaller than the second floating gate portion so as to enable adequate voltage coupling for Fowler-Nordheim tunneling to occur between the first doped well region and the first floating gate portion; and forming a floating gate shield layer so as to enclose the floating gate.

Broadly stated, the present invention also provides a shielded floating gate tunneling element structure comprising a floating gate disposed over a gate oxide in two active areas defined by first and second doped well regions formed in a substrate, the floating gate comprising a first floating gate portion over the first doped well region; and a second floating gate portion over the second doped well region; wherein the first floating gate portion is substantially smaller than the second floating gate portion so as to enable adequate voltage coupling for Fowler-Nordheim tunneling to occur between the first doped well region and the first floating gate portion; and a floating gate shield layer formed so as to enclose the floating gate.

Broadly stated, the present invention also provides a shielded floating gate tunneling element structure comprising a floating gate disposed over a gate oxide in two active areas defined by first and second NWELL regions formed in a P substrate, the floating gate comprising a first floating gate portion over the first NWELL region and a second floating gate portion over the second NWELL region wherein the first floating gate portion is substantially smaller than the second floating gate portion so as to enable adequate voltage coupling for Fowler-Nordheim tunneling to occur between the first NWELL region and the first floating gate portion; first and second diffusion regions formed within the first NWELL region and separated by a first channel region; third and fourth diffusion regions formed within the second NWELL region and separated by a second channel region; a field oxide region formed between the second and third diffusion regions; a PWELL region formed in the P substrate between the first and second NWELL regions; and a floating gate shield layer formed so as to enclose the floating gate.

These and other embodiments, features, aspects, and advantages of the invention will become better understood with reference to the following description, appended claims and accompanying drawings.

Reference symbols or names are used in the Figures to indicate certain components, aspects or features shown therein, with reference common to more than one Figure indicating like components, aspects or features shown therein.

DETAILED DESCRIPTION OF THE INVENTION

Figure 1B:
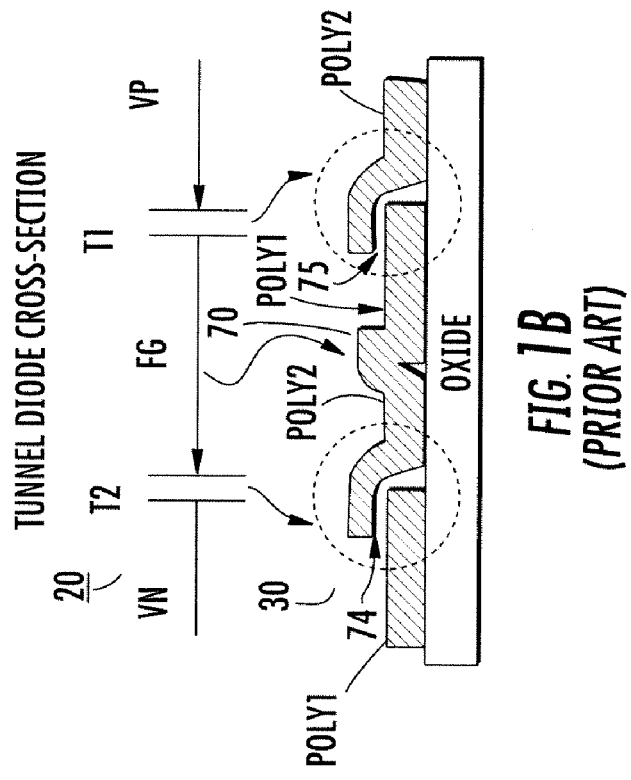
FIG. 1B is a cross-sectional view and exemplary circuit diagram illustrating the series connected tunnel diodes in FIG. 1A.
Figure 1A:
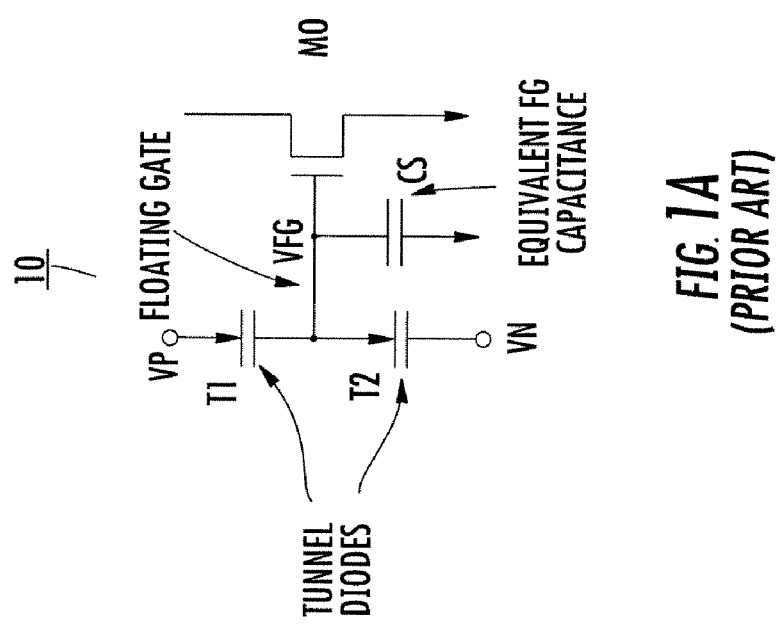
FIG. 1 is an illustrative prior art equivalent circuit diagram for the floating gate voltage reference circuit.
Figure 2:
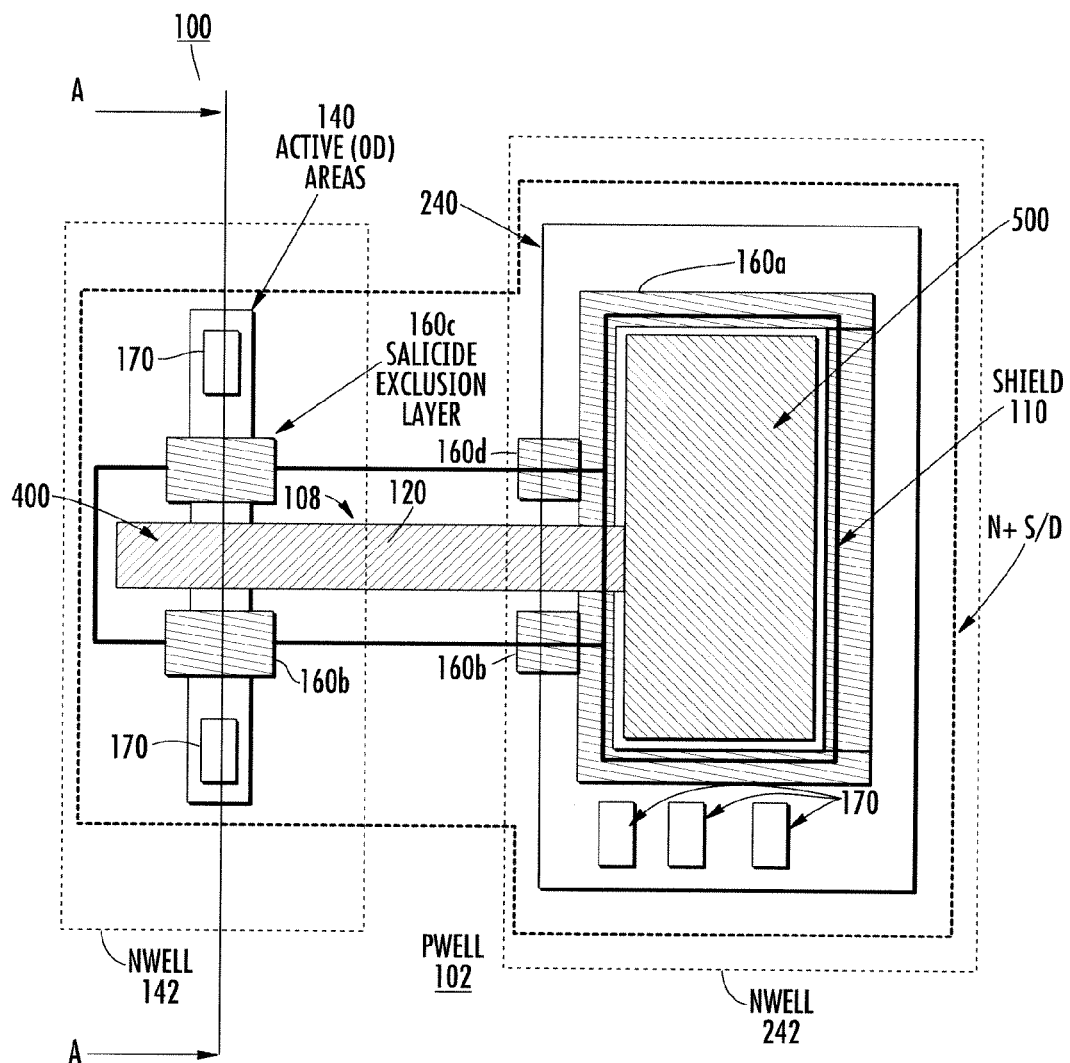
FIG. 2 illustrates a plan view of a layout of a tunnel element structure for a high precision floating gate reference circuit with a floating gate polysilicon layer fully enclosed by a conductive shielding layer according to a preferred embodiment of the present invention.
Figure 2A:
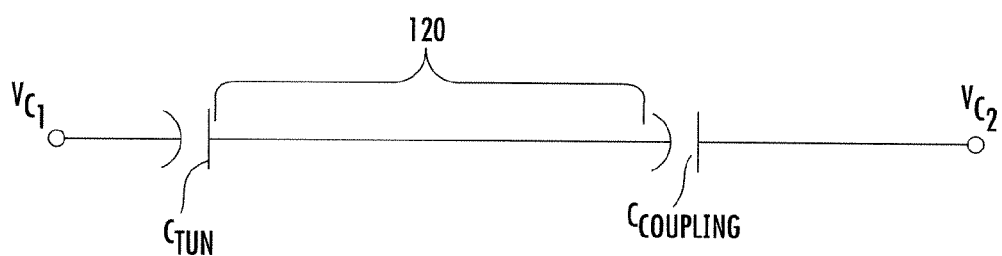
FIG. 2A is a schematic of an equivalent circuit for the structure in FIG. 2.
Figure 3A:
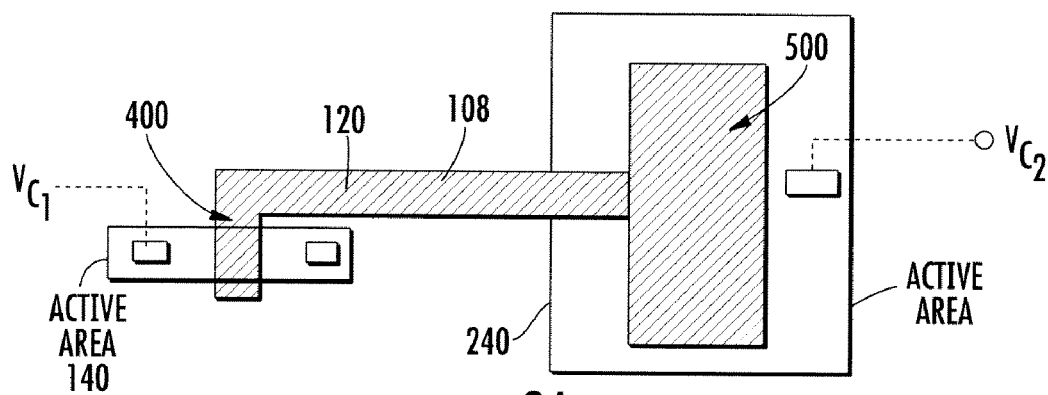
FIG. 3A is an exemplary simplified view of the layout of FIG. 2 with the active area on the left side of FIG. 2 rotated ninety degrees.
Figure 3B:
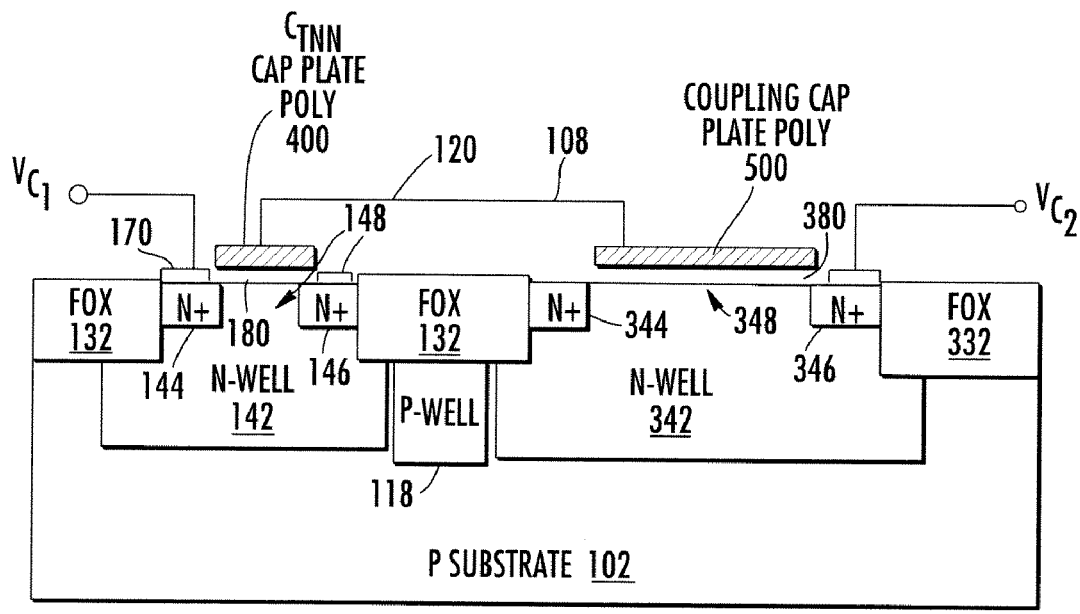
FIG. 3B illustrates a partially schematic view of the structure corresponding to the simplified layout in FIG. 3A.

FIG. 2 illustrates a plan view of a tunnel diode structure 100 with the floating gate elements fully enclosed by a floating gate conductive shielding layer according to a preferred embodiment of the present invention. The tunnel diode structure 100 is constructed using a standard CMOS processing. The equivalent circuit diagram is shown in FIG. 2A. As seen in FIG. 2A, the tunnel diode includes a tunneling capacitor, Ctun, connected in series with a coupling capacitor, Ccoupling, between terminals Vc1 and Vc2. A floating gate junction portion 120 is identified in FIG. 2A for the interconnection of a plate of Ctun and a plate of Ccoupling. Floating gate 108 includes a first floating gate portion forming a plate of Ctun, and another floating gate portion forming a plate of Ccoupling, connected by the junction portion 120. The tunnel diode structure is also referred to herein as a tunneling element in that the structure provides the tunneling functionality for injecting to and removing charges from a floating gate. The active area 140 in FIG. 2 corresponds to the tunneling capacitor, Ctun, in FIG. 2A. The active area 240 in FIG. 2 corresponds to the coupling capacitor, Ccoupling, in FIG. 2A. FIG. 3A is an exemplary simplified layout view of FIG. 2 with the active area on the left side of FIG. 2 rotated ninety degrees. FIG. 3B illustrates the structure corresponding to the layouts in FIGS. 2A and 3A.

In FIG. 3A, the entire dashed portion represents the floating gate 108, also referred to herein as the floating gate layer. FIG. 3B shows the structure including both capacitors according to the equivalent circuit diagram in FIG. 2A and the terminals Vc1 and Vc2.

The floating gate polysilicon layer 108 is disposed over gate oxide layers 180, 380 using standard CMOS processing in two active areas 140, 240 defined by two NWELL regions 142, 342 formed in a P substrate 102 surrounded by field oxide (fox). The structure corresponding to Ctun in FIG. 3B includes spaced apart N-type diffusion regions 144 and 146 formed within NWELL 142. Alternatively, the spaced-apart diffusion regions are P-type diffusion regions. A channel region 148 is defined between the diffusion regions 144 and 146. The coupling capacitor, Ccoupling, includes spaced apart N-type diffusion regions 344 and 346 formed within Nwell 342. Alternatively, the spaced-apart diffusion regions are P-type diffusion regions. A channel region 348 is defined between the diffusion regions 344 and 346. Field oxide ("Field ox") regions 132, e.g., formed using a shallow trench isolation (STI) process, local oxidation of silicon (LOCOS) process, poly buffer LOCOS process, etc., are included for providing isolation of the structure from adjacent elements. The two NWELL regions 142, 342 in FIG. 3B are typically isolated by insertion of a PWELL region 118 in the substrate 102. The PWELL region 118 spaced apart from the NWELL regions 142, 342 (as shown) helps increase the NWELL-PWELL breakdown voltage required to operate the tunnel diode with thick gate oxide.

The gate oxide layers, identified as 180 and 380 in FIG. 3B, preferably have a thickness that is the same as the gate oxide thickness of CMOS devices that are used as input/output interface devices having an operating voltage of 5 V (i.e., 5 V I/O gate oxide). In other words, the thickness for the gate oxide is preferably native to the fabrication process for 5 V I/O devices, referred to as 5 V I/O gate oxide. This enables the structure to be made using standard CMOS processes with the gate oxide greater than 70 Å (7 nm), and preferably 120 Å (12 nm) for this application. Thus, it is believed that embodiments of the present invention will work with a gate oxide thickness that enables such embodiments to be useful with devices having even higher I/O voltages.

The floating gate 108 including a first floating gate portion 400, i.e., Ctun cap plate poly in FIG. 3B, over NWELL region 142 and a second floating gate portion 500, i.e., Ccoupling cap plate poly, in FIG. 3B, over the second NWELL region 342 (seen in FIG. 3B). The capacitors Ctun and Ccoupling form a capacitor divider as shown in FIG. 2A. According to charge conservation, if Ctun is significantly smaller than Ccoupling, most of the voltage applied across this structure will be dropped across Ctun. According to the present invention, the Ctun cap plate poly 400 is much smaller than the Ccoupling cap plate poly 500, e.g., by a factor of 10, for providing adequate voltage coupling for Fowler-Nordheim tunneling to occur between NWELL region 142 and the first floating gate portion 400, with the direction of tunneling determined by high voltage application to one of the NWELL regions. Table 1, shown below, is used to illustrating the voltages to be applied to terminals Vc1 and Vc2, as seen in FIGS. 2A, 3A, and 3B, for injecting and removing charge from floating gate 108.

TABLE 1

| Operation | Vc1 (V) | Vc2 (V) |
|---|---|---|
| Inject charge to FG (write) | 0 V | High voltage |
| Remove charge from FG (erase) | High voltage | 0 V |

As shown in Table 1, application of a large positive tunneling voltage at terminal Vc2 with terminal Vc1 held at zero volts, e.g., ground, causes injection of charge at the floating gate node (write). Application of a large positive tunneling voltage at terminal Vc1 with terminal Vc2 held at zero approximately ground causes the removal of charge from the floating gate node.

During the standard CMOS process, regions of silicide are typically formed over the diffusion regions. These silicide regions are for providing low resistance contact regions to the silicon typically for connection to voltage terminals, e.g., Vc1 and Vc2 shown in FIG. 3B. Exemplary contact regions are identified as 170 in the plan view in FIG. 2. The contact regions are generally self aligned, meaning that any non-dielectric region of exposed silicon will be silicided.

Standard CMOS processing is carried out up to and including deposition of salicide exclusion layers 160, e.g., 160a seen in FIG. 2. The salicide exclusion layers 160, typically around 300 Å thickness SiO2, are deposited according to the standard CMOS process to the thickness of about 600 Å to act as an etch stop for the subsequently deposited shield layer. The thickness depends on the fabrication process and is typically 300-1000 Å.

A floating gate shield layer 110 is then deposited so as to enclose the floating gate 108. Preferably, the shield layer is deposited as an in-situ doped or intrinsic amorphous Si or poly-Silicon layer. The shield layer is patterned in such a way as to enclose the floating gate completely and then is etched using standard techniques. For the present invention, the exact dimensions of the shield layer are not critical so the etch can be carried out in wet chemistry in order to remove the deposited material from the CMOS gate topography completely. Once the shield pattern is defined, the standard salicide block pattern is applied to the wafer. The salicide block pattern is identified as 160a, 160b, 160c in FIG. 2. This salicide block pattern is required to cover edges of the shield layer and the adjacent diffusions in Si for preventing silicide shorts between these regions and for isolating them. Portions of the salicide block pattern are not shown to prevent obscuring other details of the invention. The resulting structure has the floating gate and a part of the adjacent diffusion completely enclosed by the shield layer.

Alternatively, the shielding layer can be made of a metallic film, such as TiN or TiW. If these materials are selected, the salicide block pattern applied to the film will have to be modified to cover the shield feature from being removed during the unreacted metal etch.

The salicide block pattern (appropriate for the poly-Si shield), typically TiSi2 or CoSi2, as shown at 160 is preferably provided for covering the adjacent diffusions. Other suitable salicides may be used depending on the particular CMOS fabrication facility. A salicide block pattern that covers the edges of the shield layer is shown at 160c in FIG. 4.

Figure 4:
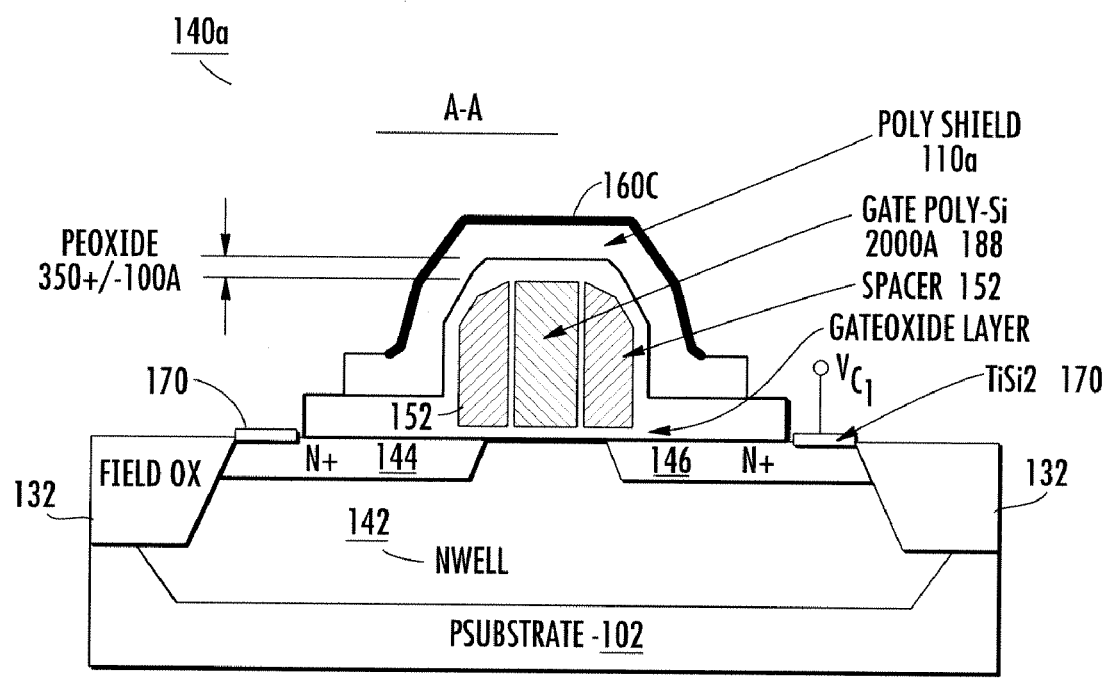
FIG. 4 is a sectional view of the structure in FIG. 2 along A-A according to a preferred embodiment which includes a poly-Si floating gate shield layer 110A and spaced apart N+ diffusion regions.

FIG. 4 is a sectional view of the structure in FIG. 2 along A-A according to a preferred embodiment which includes a poly-Si floating gate shield layer 110A and spaced apart N+ diffusion regions. It should be appreciated that the sectional views herein do not show details of structures formed by general purpose CMOS technology that are well known to one of ordinary skill in the art. The conductive shield layer 110a comprises poly-Si. The structure 140a in FIG. 4 includes spaced apart N-type diffusion regions 144 and 146 formed within an n-type well 142, which is formed in the p-type substrate 102. A channel region 148 is defined between the N-type regions 144 and 146. A poly-Si gate 188 is formed over the channel region 146. Side wall spacers 152, not seen in the layout in FIG. 2, are included on either side of the gate 188. The spacers 152 are commonly used in standard CMOS technologies, such as for lightly-doped drain (LDD) structures, for spacing the source/drain implants from the gate to prevent diffusion to gate silicide shorts. As seen in FIG. 4, the structure preferably includes an oxide, e.g., PE-oxide, of an exemplary thickness of 350+/−100 Å for the vertical space of the insulating layer between the uppermost edge of the spacers (and gate) and the corresponding lower edge of the shield. The present invention is not limited to the use of PE-oxide for the insulating layer shown.

A salicide block pattern that covers the edges of the shield layer is shown at 160c in FIG. 4. Contact regions 170 seen in FIGS. 4-6 are provided for enabling connection from the Nwell via the diffusion regions to a terminal, e.g. for a terminal Vc1 as shown in FIG. 4.

Field oxide ("Field ox") regions 132, e.g., formed using a shallow trench isolation (STI) process, local oxidation of silicon (LOCOS) process, poly buffer LOCOS process, etc., are included for providing isolation for the structure from adjacent elements.

Figure 5:
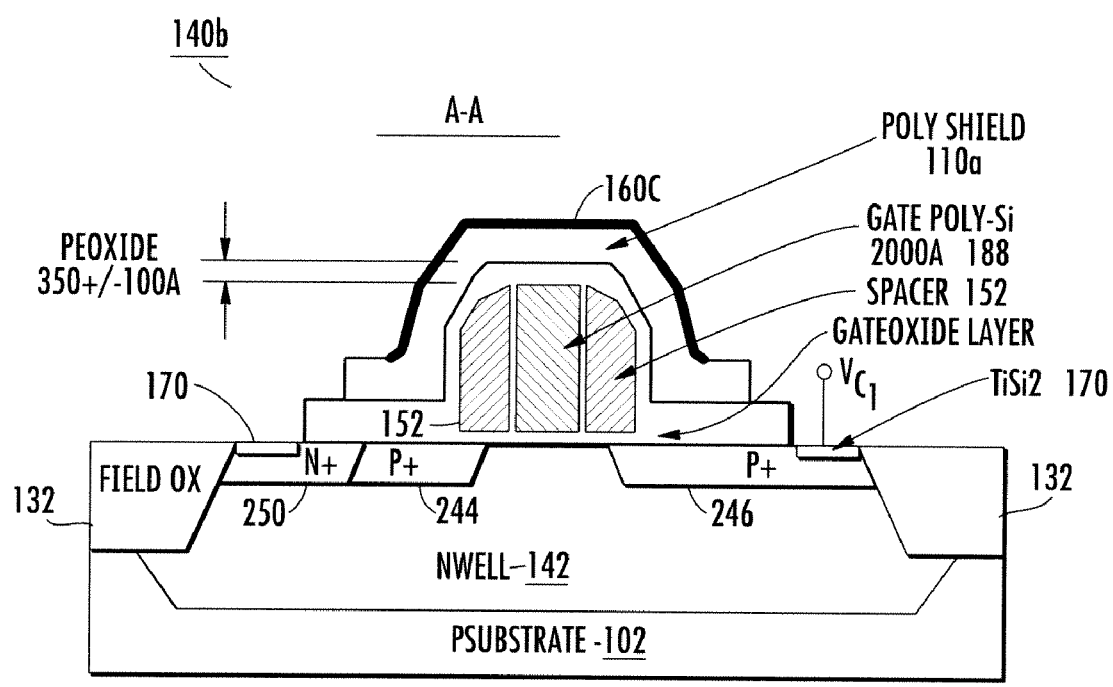
FIG. 5 is a sectional view of the structure in FIG. 2 along A-A according to an alternate embodiment which includes a poly-Si floating gate shield layer, spaced apart P+ diffusion regions, and an N+ region.

FIG. 5 is a sectional view of the structure in FIG. 2 along A-A according to an alternate embodiment which includes a poly-Si floating gate shield layer, spaced apart P+ diffusion regions, and an N+ region. The structure 140*b* includes spaced apart P-type diffusion regions 244 and 246 formed within the n-type well 142, which the formed in the p-type substrate 102. The N+ region 250 is provided as an ohmic contact to the n-well 142.

Figure 6:
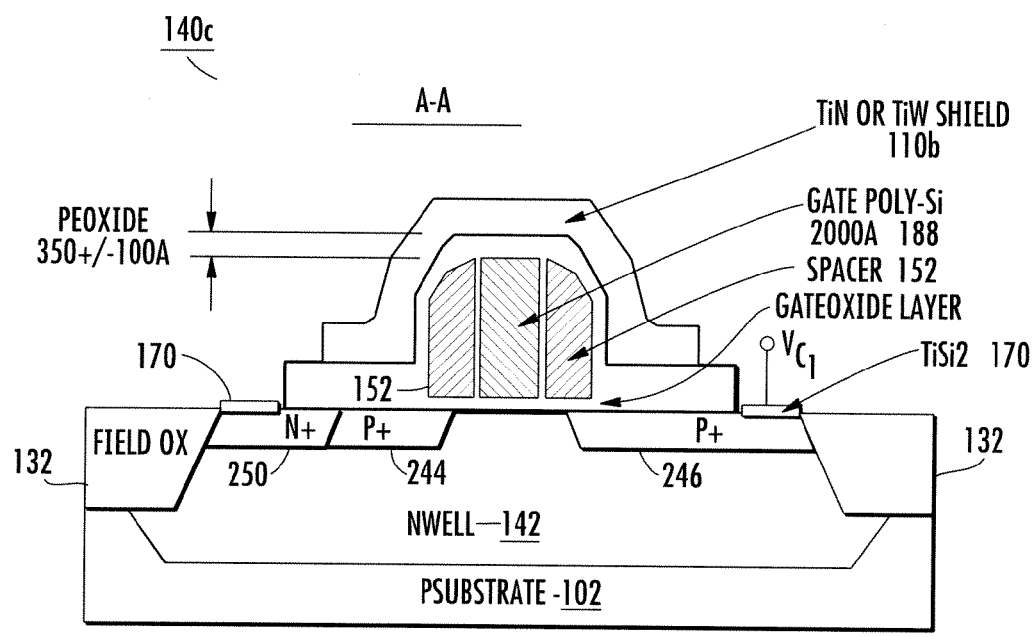
FIG. 6 is a sectional view along A-A of the structure in FIG. 2 having a TiN or TiW floating gate shield layer according to an alternate embodiment of the present invention.

FIG. 6 is a sectional view along A-A of the structure in FIG. 2 having a TiN or TiW floating gate shield layer according to an alternate embodiment of the present invention. As seen, the shield layer 110*b* surrounds the floating gate and part of the adjacent diffusions. For a metallic shield of titanium nitride, TiN, or titanium tungsten, TiW, as seen in FIG. 6, the salicide block pattern covers the entire shield pattern feature.

Having disclosed exemplary embodiments, modifications and variations may be made to the disclosed embodiments while remaining within the scope of the invention as described by the following claims.

What is claimed is:

1. A method of shielding a floating gate tunneling element structure comprising the steps of:
   disposing a floating gate over a gate oxide in two active areas defined by first and second doped well regions formed in a substrate, said floating gate including a first floating gate portion over said first doped well region and a second floating gate portion over said second doped well region, wherein said first floating gate portion is substantially smaller than said second floating gate portion so as to create adequate voltage coupling to cause Fowler-Nordheim tunneling to occur to and from said first doped well region and said first floating gate portion as a function of an applied high voltage, wherein said first and second doped well regions are NWELL regions and said substrate is a P substrate;
   forming a first and second diffusion regions within said first NWELL region and separating said first and second diffusion regions by a first channel region;
   forming a third and fourth diffusion regions within said second NWELL region and separating said third and fourth diffusion regions by a second channel region;
   forming a field oxide region between said second and third diffusion regions;
   forming a PWELL region in said P substrate between said first and second NWELL regions;
   and forming a floating gate shield layer so as to enclose said floating gate.

2. The method of claim 1, wherein the direction of the Fowler-Nordheim tunneling is determined by coupling said high voltage to one of said doped well regions.

3. The method of claim 2, wherein the coupling of said high voltage to said first doped well region causes removal of charge from said floating gate.

4. The method of claim 3, wherein the coupling of said high voltage to said second doped well region causes injection of charge onto said floating gate.

5. The method of claim 1, wherein the step of forming the floating gate shield layer includes depositing a salicide exclusion layer using standard CMOS processing for providing an etch stop for said shield layer.

6. The method of claim 1, further comprising applying a salicide block pattern onto said deposited shield layer for providing isolation thereof.

7. The method of claim 1, wherein said shield layer is a conductive layer comprising poly silicon.

8. The method of claim 1, wherein said shield layer is a conductive layer comprising a metallic film.

9. The method of claim 8, wherein said metallic film comprises a TiN film.

10. The method of claim 8, wherein said metallic film comprises a TiW film.

11. The method of claim 5, where the salicide exclusion layer is deposited to a thickness of about 600 A.

12. The method of claim 1, wherein the step of forming the floating gate shield layer includes depositing a conductive layer and etching said conductive layer using standard CMOS processing.

13. The method of claim 1, wherein said gate oxide has a thickness of between 70 Angstroms and 150 Angstroms.

14. The method of claim 13, wherein said gate oxide has a thickness of about 120 Angstroms.

15. A shielded floating gate tunneling element structure comprising:
   a floating gate disposed over a gate oxide in two active areas defined by first and second NWELL regions formed in a P substrate, said floating gate comprising a first floating gate portion over said first NWELL region and a second floating gate portion over said second NWELL region wherein said first floating gate portion is substantially smaller than said second floating gate portion so as to create adequate voltage coupling to cause Fowler-Nordheim tunneling to occur to and from said first NWELL region and said first floating gate portion as a function of an applied high voltage;
   first and second diffusion regions formed within said first NWELL region and separated by a first channel region;
   third and fourth diffusion regions formed within said second NWELL region and separated by a second channel region;
   a field oxide region formed between said second and third diffusion regions;
   a PWELL region formed in said P substrate between said first and second NWELL regions; and
   a floating gate shield layer formed so as to enclose said floating gate.

16. A shielded floating gate tunneling element structure comprising: a floating gate disposed over a gate oxide in two active areas defined by first and second NWELL regions formed in a P substrate, said floating gate comprising a first floating gate portion over said first NWELL region and a second floating gate portion over said second NWELL region wherein said first floating gate portion is substantially smaller than said second floating gate portion so as to enable adequate voltage coupling for Fowler-Nordheim tunneling to occur between said first NWELL region and said first floating gate portion;
   first and second N-type diffusion regions formed within said first NWELL region and separated by a first channel region;
   third and fourth N-type diffusion regions formed within said second NWELL region and separated by a second channel region;
   a field oxide region formed between said second and third N-type diffusion regions;
   a PWELL region formed in said P substrate between said first and second NWELL regions; and
   a floating gate shield layer formed so as to enclose said floating gate.

17. The structure of claim 15, wherein said first and second diffusion regions are P-type diffusion regions.

18. The structure of claim 17, further comprising an N-type diffusion region formed adjacent to said first P-type diffusion region for providing an ohmic contact to the first NWELL region.

\* \* \* \* \*